United States Patent [19]

Ouyang

[11] 4,065,783
[45] Dec. 27, 1977

[54] SELF-ALIGNED DOUBLE IMPLANTED SHORT CHANNEL V-GROOVE MOS DEVICE

[76] Inventor: Paul Hsiung Ouyang, 950 Larkspur Ave., Sunnyvale, Calif. 94086

[21] Appl. No.: 732,551

[22] Filed: Oct. 18, 1976

[51] Int. Cl.$^2$ .................. H01L 27/04; H01L 29/78
[52] U.S. Cl. ........................................ 357/41; 357/23; 357/46; 357/55
[58] Field of Search ............... 357/23, 41, 55, 90, 357/91, 48, 46

[56] References Cited
U.S. PATENT DOCUMENTS 3,806,371  4/1974  Barone ............................. 357/41
4,000,429  12/1976  Yoshida et al. .................. 307/214 X

OTHER PUBLICATIONS

Holmes et al., "UMOS-A New Integrated Circuit Technology", Solid-State Electronics, Aug. 1974, vol. 17, pp. 791-797, Pergamon Press.
Stone et al., "Recent Advances in Ion Implantation-A State of the Art Review", Solid State Technology, June 1976, pp. 35-44.
Electronics, Apr. 1, 1976, pp. 76-81.

Primary Examiner—Stanley D. Miller, Jr.
Assistant Examiner—James W. Davie

[57] ABSTRACT

A short-channel V-groove MOS transistor is provided having laterally disposed source, drain, gate dielectric on the same face of a lightly p-doped substrate. Using ion implantation, a heavily doped vertical channel layer is symmetrically provided below and between the drain and the source in the substrate and being self-aligned to the gate which is formed in the V-groove by a silicon dioxide layer and a conductor layer. Appropriate leads contact the gate conductor, the drain and the source. Such transistor can be incorporated in an integrated circuit to form an inverter circuit with a lateral depletion-mode V-MOS as a load transistor.

28 Claims, 13 Drawing Figures

SELF-ALIGNED DOUBLE IMPLANTED SHORT CHANNEL V-GROOVE MOS DEVICE

FIELD OF THE INVENTION

This invention relates to a planar short-channel V-groove MOS transistor structure and more particularly to such MOS structure that has a precisely controlled threshold voltage and channel length, and has a self-aligned gate.

BACKGROUND OF THE INVENTION

Presently, there are two approaches in realizing short-channel (1 micron) MOS devices employing conventional photolithographic techniques. One approach is the so-called DMOS approach which is described by T. P. Cauge, et al., in an article entitled "DOUBLE-DIFFUSED MOS TRANSISTORS ACHIEVE MICROWAVE GAIN" appearing in Electronics, pp. 99-104, Feb. 15, 1971. The other approach is the VMOS approach described by T. J. Rodgers and J. D. Meindl in an article entitled "VMOS: HIGH-SPEED TTL COMPATIBLE MOS LOGIC" in IEEE J. of Solid State Circuits, Vol. SC-9, pp. 239-249, Oct. 1974. Using these two approaches, the effective source-to-drain spacing of a MOS device is controlled similar to those in which the basewidth of a bipolar transistor is formed, namely by diffusion. Therefore, 1-micron devices can be realized. The speed capability of these devices is greatly enhanced over the conventional MOS devices.

However, the process controllability of the threshold voltage in a DMOS is rather poor, resulting in low production yield. One of the major reasons for poor $V_T$ controllability is that $V_T$ depends on the maximum channel impurity concentration, $N_{Amax}$, which is not easily controllable. In a DMOS, the channel is formed by the lateral difference of a successive p-type diffusion — the channel diffusion, and an n-type diffusion — the source diffusion made through the same oxide opening. $N_{amax}$ occurs at the intersection of the source and channel diffusion profiles which have shapes of complementary error function. Any variation in time, temperature or gas flow in either diffusion will vary $N_{Amax}$ significantly, and therefore $V_T$. Furthermore, during the channel diffusion, a thin oxide layer is generally grown to keep the surface clean. During the subsequent removal of this oxide layer for source diffusion, an uncertainty in oxide window edges from run to run may occur. Thus an uncertainty in $N_{Amax}$ will occur correspondingly. Moreover, presently there exists no experimental method by which a lateral diffusion profile can be measured. Therefore, on-process measurement for the diffusion profile subsequent to each high temperature process is not possible. Consequently, LSI DMOS ICs have not been manufactured.

For VMOS, the fabrication process is also complex, requiring tight epitaxial control and seven masking steps instead of four required by conventional p-channel devices. The additional masking steps require etching, aligning, and heating steps, which cause device yield loss due to the probability of inherent misalignments and movement of the diffusion within the device. Furthermore, linear resistors are required as load device, and are known to be inferior to the depletion mode load devices in performance. Moreover, since the substrate of the VMOS is used as common source, only NOR gates can be constructed. Its application, therefore, is limited.

In order to overcome the above-mentioned shortcomings, applicant develop a nonsymmetrical planar double implanted VMOS structure (VDMOS) shown in FIG. 5. The region 74 — the vertical channel of the VDMOS allows ion-implantation to be used in determining $N_{Amax}$ and the effective channel directly through accurately controlling the implanting energy and dosage. The fabrication process is also simplified, and the yield enhanced. Furthermore, the VDMOS is a planar device and can allow both enhancement mode or depletion mode devices to be fabricated on the same wafer to be used as load devices.

However, the VDMOS has the following shortcomings: 1), the alignment tolerance for the V-groove definition with respect to the channel is approximately half the length of the V-groove opening. For devices with small V-groove openings, the alignment tolerance would also be small. Any misalignment exceeding the tolerance will cause the device to fail and yield loss; 2), the area shared by the channel and the source region is relatively large, resulting in large source-to-channel capacitance; 3), the channel is non-symmetrical about the V-groove, or with respect to the drain and source; and 4), the fabrication process requires six masking steps.

SUMMARY OF THE INVENTION

The present invention has been made in order to solve the problem stated above. It is, therefore, an object of the invention to provide a high frequency insulated gate field effect transistor which is planar, and adaptable for integrated circuits.

It is another object of the invention to provide a high frequency V-groove insulated gate field effect transistor in which the gate is self-aligned to the channel.

It is another object of the invention to provide a high frequency V-groove insulated gate field effect transistor which has a minimized parasitic capacitance.

It is another object of the invention to provide a high frequency V-groove insulated gate field effect transistor in which the channel is symmetrical with respect to the drain and source.

It is another object of the invention to provide a high frequency V-groove insulated gate field effect transistor in which the threshold voltage can be precisely and reproducibly controlled.

It is another object of the invention to provide a high frequency V-groove insulated gate field effect transistor in which low threshold voltage (0.3 - 1 volt) can be easily realized.

It is another object of the invention to provide a high frequency V-groove insulated gate field effect transistor in which the effective channel length can be precisely and reproducibly controlled.

It is another object of the invention to provide a high frequency V-groove insulated gate field effect transistor in which the effective channel length of 0.05 to 1.0 micron can be realized.

It is another object of the invention to provide a high frequency V-groove insulated gate field effect transistor in which the punch-through voltage of the source and drain is greatly increased.

Another essential object of the invention is to provide an improved integrated circuit in which the switching or amplifying transistor is a high frequency V-groove insulated gate field effect transistor and the load transistor is made as a planar depletion type V-groove field effect transistor having higher punch-through voltages and load characteristics which are nearly equivalent to constant current source, and which is simpler and cheaper to manufacture.

A further object of the invention is to provide an improved integrated circuit of the above character in which the parasitic field inversion is minimized.

Briefly, the foregoing and other objects of the invention are accomplished by providing a high resistivity p-doped wafer on which N+-type diffused drain and source regions of a switching transistor are formed on the opposite sides of a V-groove which extends into the wafer. The source and drain are extended and terminated on the opposite surfaces of the V-groove by a thin implanted N+ layer. Another thin p-type layer is selectively formed by ion-implantation through an oxide opening which is subsequently used for forming the V-groove by anisotropic etching. Said p-type layer lies below and adjacent said thin N+ layer. The portion of said p-type layer exposed by the V-groove forms a vertical effective channel. A second diffused drain region for the load transistor is selectively formed, and together with the first drain region, are exposed by the opposite surfaces of a second V-groove. A gate dielectric layer is provided on these V-groves with a conductive layer as gate electrode thereover.

The advantages of the present MOS transistors and the operation and the method of manufacturing thereof will become more apparent by the following description in conjunction with the accompanying drawings.

DESCRIPTION OF THE PREFERRED EMBODIMENTS OF THE INVENTION

Figure 1:
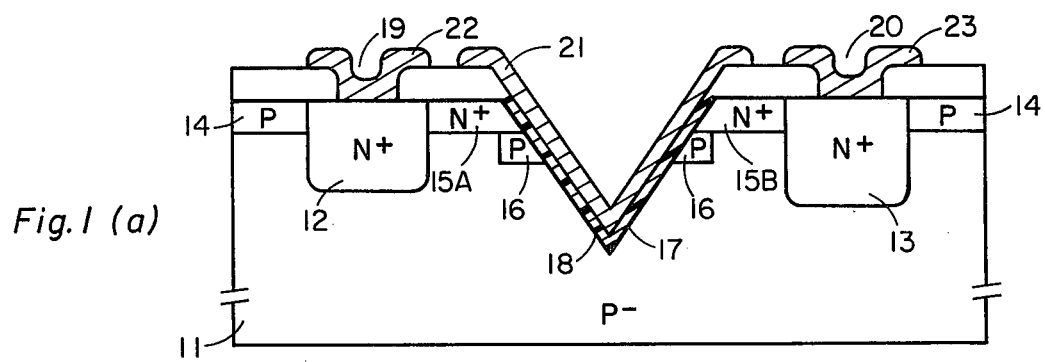
FIG. 1(a) is a schematic, cross sectional view of a device, one embodiment of the present invention.
FIG. 1(b) is a layout of the aforementioned device of the present invention as viewed from the top.
Figure 1:
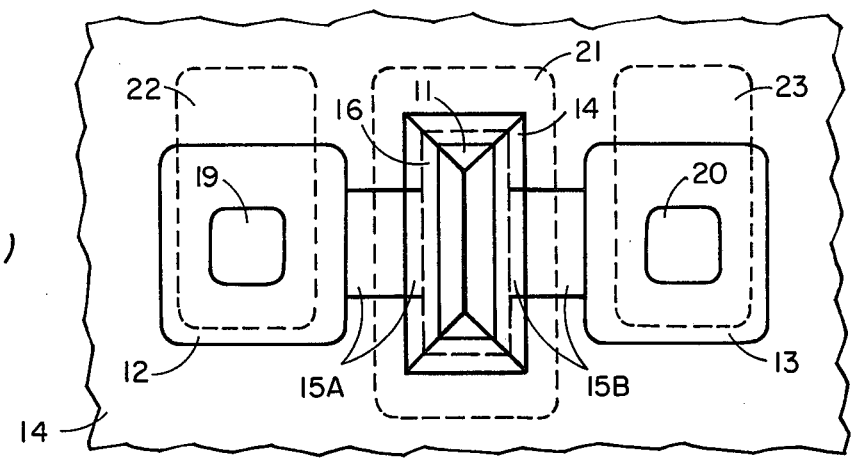

A portion of an integrated circuit including a self-aligned doubly implanted V-MOS transistor formed in accordance with the invention is shown in FIG. 1 and will be termed SDV-MOS hereafter.

Referring now to FIG. 1, the SDV-MOS transistor is formed on a lightly p-doped substrate 11 with an acceptor dopant concentration typically in the range of $10^{13}$ to $5 \times 10^{15}$ atoms per cubic cm. N+-type regions 12 and 13 are selectively formed therein to be the source and the drain respectively. Thin layers 15A and 15B are the source and the drain extensions respectively to a V-groove 17. The portion of a thin layer 16 which underlies a portion of layers 15A and 15B is exposed by V-groove 17 to form an effective channel. The portion of substrate 11 exposed by V-groove 17, being always inverted, forms an effective resistor in series with said effective channel. A thin oxide layer 18 overlying the entire V-groove 17 provides gate dielectric and supports gate electrode 21. Contact apertures 19 and 20 provide electrical contacts to source 12 and drain 13. Gate leads 21, source leads 22 and drain leads 23 are formed for appropriate connection to an electrical circuit.

In usual operation, the source 12 and the substrate 11 are preferrably grounded and positive voltages are applied to drain lead and gate lead. The positive voltage on gate conductor induces an n-type inversion layer in the surface portion of channel layer 16 exposed by the V-groove. Current then flows through the drain and drifts across the surfaces of the V-groove into the source 12. Thus this device in FIG. 1 acts like a voltage-controlled switch.

The impurity concentration of substrate 11 is preferred to be low and is typically $10^{14}$ atoms per cubic cm, so that the portion of substrate 11 exposed by V-groove 17 is deeply inverted by the positive surface oxide charges at the SiO$_2$-Si interface thereof to form a resistor with small resistance in series with said effective channel. The lightly doped substrate 11 also results in small substrate-to-source capacitance, substrate-to-drain capacitance, total gate capacitance, and substrate bias sensitivity, while providing high avalanche breakdown voltage at the drain PN junction. In addition, a depletion type V-MOS transistors can be fabricated without additional processing steps.

Still referring to FIG. 1, N+-type source 12 and drain 13 can be formed by standard diffusion process to a depth of approximately 1 micron. N+-type layers 15A and 15B are preferred to be thin, typically in the range of 0.1 to 0.3 micron, and can be formed by ion implantation. The surface area thus exposed by the V-groove is small, resulting in small gate-to-drain or gate-to-source overlap capacitance. The sheet resistivity of this layer is preferred to be less than 50 ohms per square to provide small series resistance. Arsenic is generally preferred to be the impurity used for ion-implantation, because it has a low diffusion coefficient and forms a very abrupt junction.

The portion of region 16 exposed by the V-groove forms the effective channel symmetrical with respect to source 12 and drain 13. Since the effective channel formed from region 16 is vertical, ion-implantation techniques can be used to determine the impurity profile of the channel directly. Using ion-implantation, the dopant depth distribution and dosages can be precisely controlled, and therefore, $V_T$, which depends on the maximum channel impurity concentration, can be precisely and reproducibly controlled. Furthermore, using ion-implantation, channel length can be more accurately controlled and shorter channel length can be realized than heretofore possible, while low threshold voltage in the range of 0.3 to 1 volt can be easily realized.

The presence of V-groove 17 which separates source 12 and drain 13 greatly increases the punch-through voltage between source 12 and drain 13 because the drain depletion layer, at an increasing drain voltage, will extend mainly into the bulk of substrate 11 while extending only slowly toward the source.

V-groove 17 is formed by anisotropic etching as described by D. B. Lee in an article entitled "ANISOTROPIC ETCHING OF SILICON" J.A.P. Vol. 40, No. 11, Oct. 1965, pp. 4569–4574.

The forming of V-groove 17 utilizing the same oxide window opening as used in forming region 16 has several advantages. One advantage is that the need to align the gate to the channel is eliminated. Devices with very small-dimension can be fabricated without possible yield loss due to misalignment of the channel to the gate. Another advantage is that the channel thus formed will be symmetrical about drain 13 and source 12, so that the drain and the source can be freely interchanged as desired. Another advantage is that the fabrication process is further simplified since only one masking step is required for both channel and gate. A further advantage is that since both the implantation of P region 16 and V-groove etching are done through the same oxide window, the resulting area of the interface between P region 16 and N+ layer 15, after the V-groove etching, will be minimized and therefore the capacitance resulted between them will also be minimized.

Channel stopper 14 has an impurity doping concentration in the range of $10^{16}$ and $10^{18}$ atoms per cubic cm. Thus current leakage between devices due to a possible inversion layer along the surface of substrate 11 can be prevented. The depth of layer 14 should be such that it will touch or be adjacent to the implanted channel region 16 so that the surface current leakage from the source to the drain of the same device along the surfaces of the V-groove can be prevented also. Layer 14 can be formed either by an unmasked boron implantation to simplify the fabrication process or by a masked boron diffusion or implantation to increase the breakdown voltage between devices. In the masked diffusion or implantation process, layer 14 surrounds, but does not touch, source 12, drain 13, source extension 15A and drain extension 15B and is at a distance of a few microns.

Figure 2:
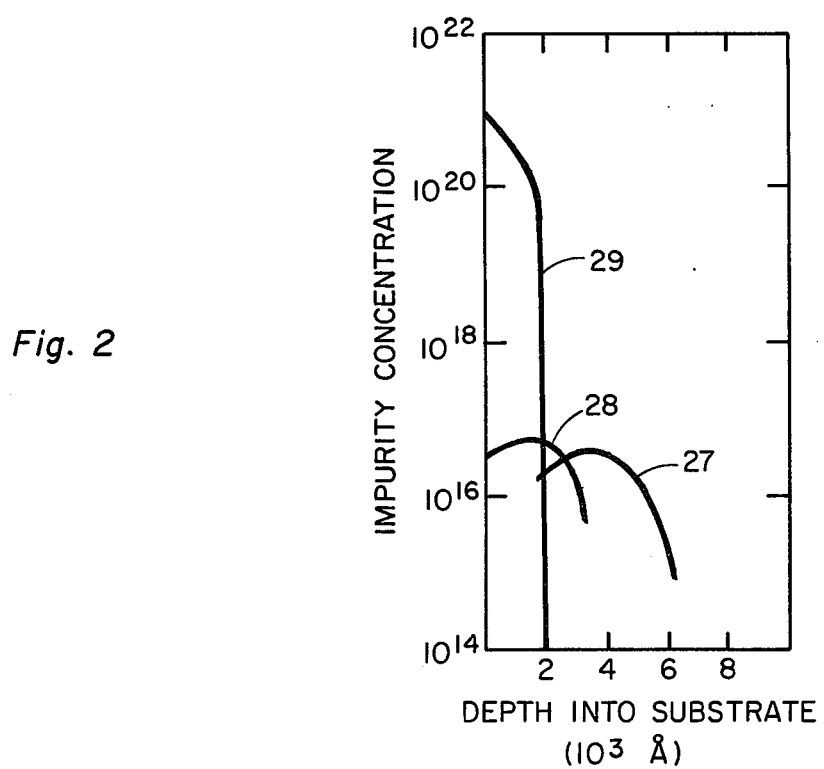
FIG. 2 is a graphical representation of typical impurity profiles of the channel stopper, channel, and source of a device of the present invention.

FIG. 2 shows typical implanted impurity profiles 27, 28 and 29, concentrations vs distances into substrate 11, of channel, channel stopper and source, respectively, of a SDV-MOS transistor of the present invention. It shall be noted that the maximum impurity concentration of channel profile 27 lies below source profile 29 into substrate 11. Thus the threshold voltage of the present SDV-MOS transistor will not be significantly affected by process variations such as in diffusion time or temperature during the gate oxidation or annealing process. Good threshold voltage reproducibility is thus expected.

In an inverter circuit, a depletion mode transistor used as a load device is generally preferred. A depletion mode load, acting as a nearly constant current source in the switching circuit, can yield faster switching speed, better circuit and device operating tolerance and lower power dissipation than an enhancement-mode or resistor load. However, in the actual operation, a substrate-to-source bias sensitivity would result in non-ideal I-V characteristics and a degradation in performance. This substrate-to-source bias sensitivity can be minimized using a high resistivity substrate. However, in a conventional MOS structure this posts a limitation in the minimum drain-to-source spacing without "punch-through". For example, punch-through readily occurs at a drain voltage of 1 volt with respect to the source and/or substrate in a conventional MOS device with 5 micron channel length and a substrate doping concentration of $10^{14}$ atoms per cubic cm. Using a lateral V-MOS, the punch-through voltage is greatly enhanced by the V-shaped gate structure. A lateral depletion mode V-MOS transistor can be fabricated along with the SDV-MOS transistor of this invention on the same substrate without the need for additional processing steps.

The steps of the manufacturing process of an SDV-MOS IC device used as an amplifying or switching transistor together with a lateral depletion-mode V-MOS transistor as a load device employing the present invention are presented in FIGS. 3(a) to 3(h).

Figure 3:
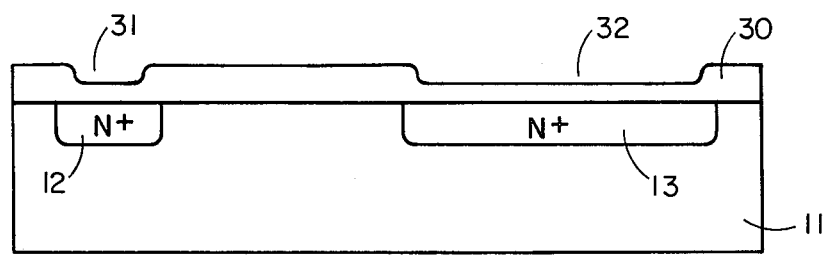
FIGS. 3(a), (b), (c), (d), (e), (f), and (g) are enlarged sectional views showing, respectively, successive process steps for fabricating an integrated inverter circuit according to the invention.
FIG. 3(h) is an equivalent circuit of the integrated inverter circuit shown in FIG. 3(g).
Figure 3:
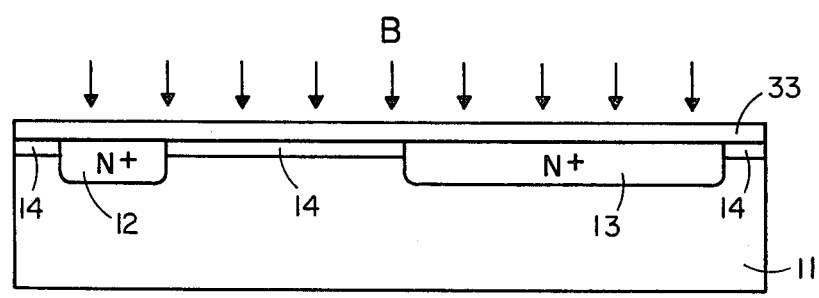
Figure 3:
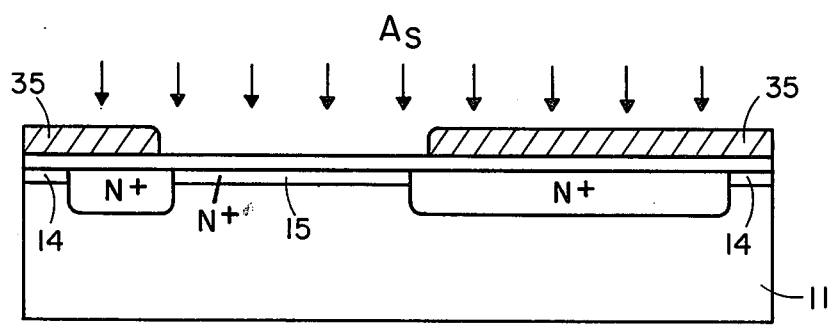
Figure 3:
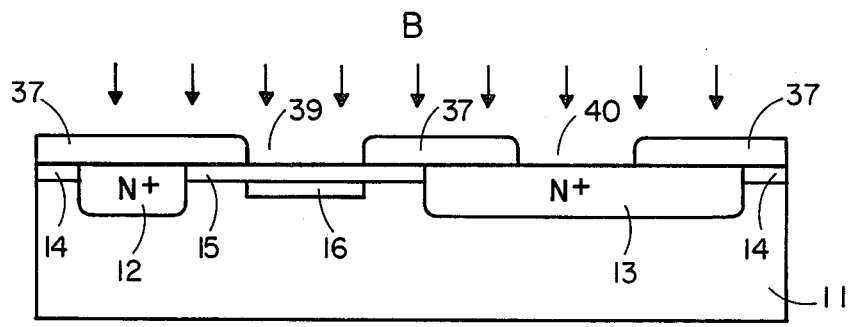
Figure 3:
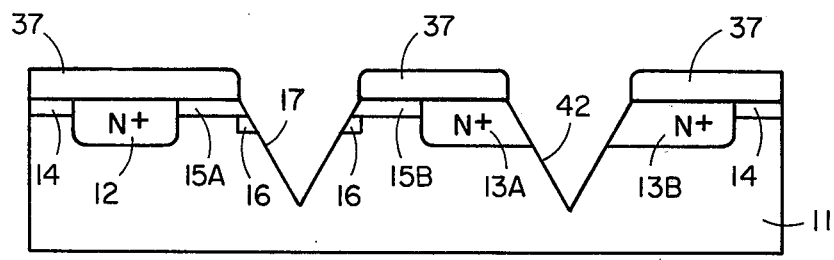
Figure 3:
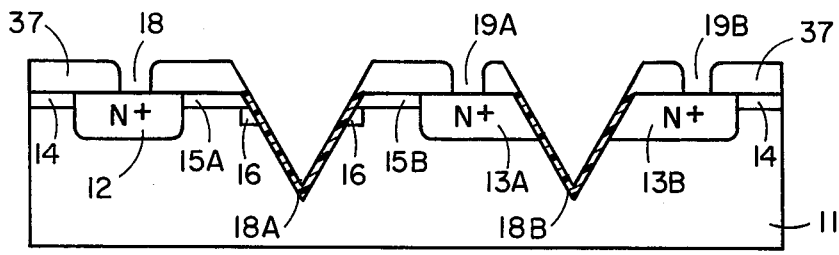
Figure 3:
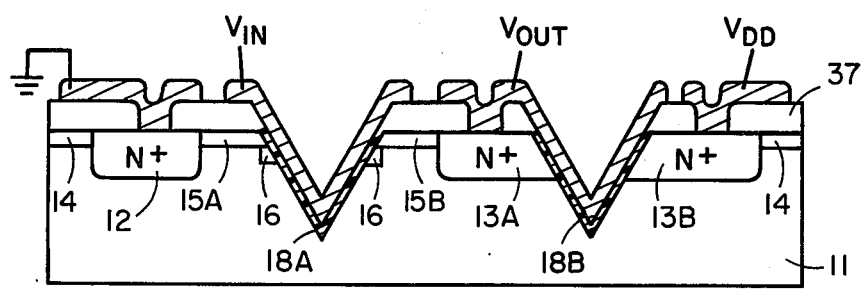
Figure 3:
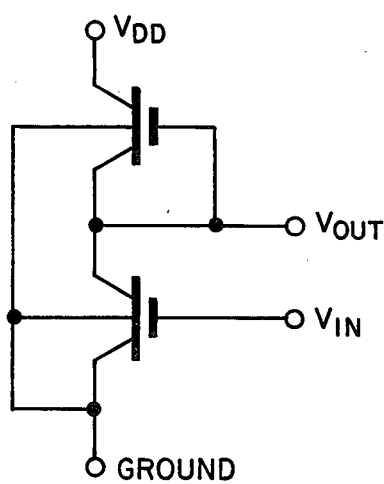

Referring now to FIG. 3(a), a layer of silicon dioxide 30 is grown on a lightly p-doped silicon substrate that has a (100) crystallographic oriented surface. The oxide layer 30 can be formed at 1200° C in steam to a thickness of 6000 A to act as a mask against impurity diffusion. Then, a first mask (not shown) is utilized in connection with conventional photolithographic and etching techniques to open windows 31 and 32. Then, through these windows phosphorus is diffused into the substrate 11 by conventional diffusion techniques to form regions 12 and 13 which have surface concentration of $10^{21}$ atoms/c.c and a depth of 1 micron. During the diffusion process, an oxide layer is grown over the windows 31 and 32. The resultant structure is shown in FIG. 3(a). The N+ region 12 is the source for the SDV-MOS transistor while region 13 comprises the drain of the SDV-MOS transistor and the drain and source of the lateral V-MOS transistor to be formed.

Next, referring to FIG. 3(b), oxide layer 30 being removed, a thin oxide layer 33 is regrown to a thickness of 500 A. A thin p-type layer 14 serving as the channel stopper is then formed adjacent to the surface of the substrate 11 by an unmasked boron implantation. Annealing or impurity redistribution can be performed if desired.

Next, as shown in FIG. 3(c), using the hardened photoresist 35 as a second mask, a N+-type layer 15 is formed by a high dosage (typically $10^{15}$ atom/cm$^2$) arsenic implantation. Annealing and redistribution of impurity can be performed again if desired.

Next, referring to FIG. 3(d), with hardened photoresist 35 being removed, a silicon dioxide film 37 is deposited on the entire wafer by chemical vapour deposition (CVD) to a thickness of 8000 A. Using a third mask (not shown), oxide windows 39 and 40 are opened. A high energy (e.g. 200 Kev), low dosage, typically $5 \times 10^{12}/cm^2$, boron implantation is then performed to form layer 16 through the window 39, while through window 40, the p-type impurity disappears because the N-type impurity concentrate in region 13 is much higher.

If desired, a thin oxide can be grown prior to implanting the layer 16 to prevent possible boron channeling.

After the boron implantation is carried out, the structure in FIG. 3(d) is annealed at a temperature of approximately 900° C for a period of approximately 15 minutes to electrically activate the implanted ions.

After the annealing operation has been completed, any oxide in windows 39 and 40 are removed by a buffered hydrofluoric acid.

Then, as shown in FIG. 3(e), anisotropic etching is performed to form V-groove 17 and 42. The region 13 is completely separated into 13A and 13B by V-groove 42 to form the source and drain of the load transistor. Any oxide overhanging the V-groove due to undercut is then removed.

Next, as shown in FIG. 3(f), with the surfaces of V-groove 17 and 42 being cleaned using conventional MOS techniques, thin gate oxide layers 18A for the switching transistor and 18B for the depletion load transistor are grown. Contact openings 18, 19A and 19B are formed using a 4th mask (not shown) in connection with conventional photolithographic and etching techniques.

Next, referring to FIG. 3(g), aluminum is deposited, and is defined using a 5th mask in connection with conventional photolithographic and etching techniques. The final configuration is shown in FIG. 3(g).

FIG. 3(h) is an equivalent circuit diagram of the integrated inverter circuit shown in FIG. 3(g).

It shall be understood that semiconductors other than silicon, such as GaAs, can be used as the starting material. It shall also be understood that the opposite type of impurity can be used in the respective steps of the process described above. It shall also be understood that conductors other than Al, such as Au, Ag, polysilicon etc., can be employed for metallization. It shall also be understood that dielectrics such as $Si_3N_4$ etc., can be used to form a second insulating layer atop of silicon dioxide layers 18A, 18B and 37.

Figure 4:
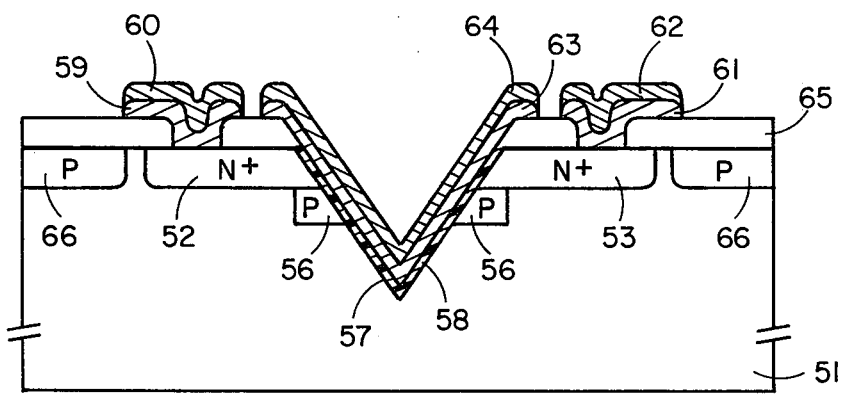
FIG. 4 is a sectional view showing another embodiment of the present invention.
Figure 5:
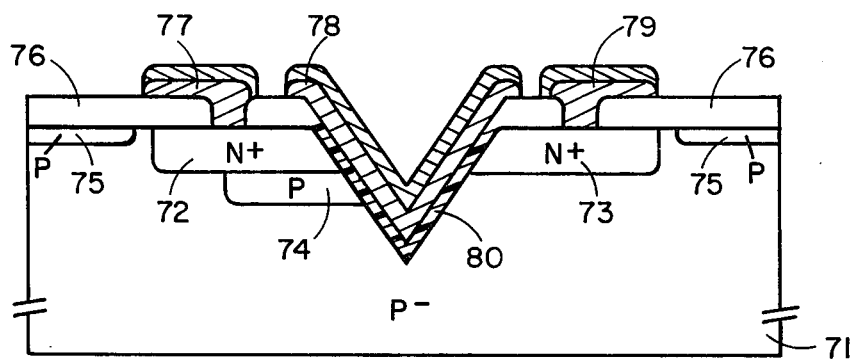
FIG. 5 is a sectional view of an asymmetrical V-MOS of prior art.

FIG. 4 shows the cross sectional view of another embodiment of the present invention. The device shown in FIG. 4 is quite similar to that shown in FIG. 1. The device is formed in a lowly p-doped substrate 51. N+-type layers 52 and 53 form the source and the drain therein. A p-type layer 56 which is the effective channel is formed by ion implantation using the same oxide window opening as used in forming V-groove 75. Thus the device according to FIG. 4 is self-aligned. Said drain and source region are thin. Thus, special metallization such as Mo/Au has to be used. Mo provides a good contact to the oxide and prevents gold from diffusing into the substrate. Thus, referring to FIG. 4, drain leads 59 and 60, sources leads 61 and 62 and gate leads 63 and 64 are made of Mo/Au respectively.

The procedures for fabricating the device of FIG. 4 are quite similar to those for fabricating the switching transistor of FIG. 3(g) and can be described by the steps from FIG. 3(b) to FIG. 3(g). Thus, like the conventional p-channel process, only 4 masking steps are required. Thus it can be manufactured more economically. The device according to FIG. 4 and its fabrication process are welll suited to those electrical circuits where only enhancement type MOS transistors are being used for both the load and the switching transistor.

Accordingly, it is to be understood that variations to the particularly described embodiments may be made by those skilled in the art without necessarily departing from the spirit and scope of the invention.

What is claimed is:

1. A self-aligned insulated gate field effect transistor device, comprising:
   a. a lightly p-doped semiconductor body having a surface portion and containing an acceptor dopant concentration of about $10^{13}$ to $5 \times 10^{15}$ atoms per cubic cm,
   b. N-type diffused drain and source regions selectively located beneath and extending to said surface portion of said semiconductor body,
   c. a V-groove adajcent said surface portion and extending into said semiconductor body intermediate said drain and said source regions, said V-groove having first and second side surfaces and first and second end surfaces,
   d. a first, thin N-type, layer forming a source extension located beneath said surface portion of semiconductor body extending from said source to said first side surface of said V-groove,
   e. a second, thin N-type, layer forming a drain extension located beneath said surface portion extending from said drain to said second side surface of said V-groove,
   f. a third, p-type, layer forming a portion of the channel of said transistor, having an acceptor dopant concentration higher than that of said substrate, selectively located beneath portions of said first and said second layers in said semiconductor body and terminated on all four surfaces of said V-groove,
   g. a fourth, thin p-type, layer forming a channel stopper, having an acceptor dopant concentration higher than that of said semiconductor body but lower than that of said first layer, said second layer, said source region and said drain region, located adjacent to and beneath said surface portion of said semiconductor body, and surrounding said first and said second layers, said drain region, said source region, and said V-groove,
   h. at least one insulating layer forming a gate dielectric overlying the entire exposed surfaces of said V-groove,
   i. at least one conducting layer forming a gate electrode overlying the entire V-groove atop said insulating layer,
   j. conductor means in electrical contact with said drain and said source regions.

2. The device of claim 1, wherein the donor impurity concentration of said first layer is at least $10^{18}$ atoms per cubic cm.

3. The device of claim 1, wherein the thickness and impurity concentration of said second layer are the same as those of said first layer.

4. The device of claim 1, wherein the maximum impurity concentration of said third layer is in the range of $10^{16}$ to $10^{18}$ atoms per cubic cm.

5. The device of claim 4, wherein the maximum impurity concentration of said third layer lies below the interface of said second layer and said third layer in said semiconductor body.

6. The device of claim 5, wherein said third layer is adjacent to said first and said second layers.

7. The device of claim 1, wherein said fourth layer is overlying and adjacent to said third layer on a portion of exposed surfaces of said V-groove.

8. The device of claim 1, wherein the impurity concentration of said fourth layer is in the range of $10^{16}$ $10^{18}$ atoms per cubic cm.

9. The device of claim 1, wherein said drain, said source and said gate electrodes are formed of aluminum.

10. The device of claim 9, wherein said third layer is self-aligned to said V-groove opening.

11. The device of claim 1, wherein said V-groove is etched to its completion through the same oxide opening as used in forming said third layer.

12. The device of claim 1, wherein portions of said first layer, said second layer, said third layer, said fourth layer and said semiconductor body are exposed by said V-groove.

13. The device of claim 1, wherein said semiconductor body is silicon.

14. The device of claim 1, wherein said gate insulating layer is $SiO_2$.

15. An integrated circuit containing a V-groove depletion type load transistor connected in series with a V-grooved enhancement type switching transistor, said integrated circuit comprising:

a. a semiconductor body having a surface portion, a lightly doped p-type impurity therein, b. a first N-type region forming the source of said switching transistor selectively formed beneath and extending to said surface portion of said semiconductor body, c. a second N-type region forming the drain of said switching transistor and the source of said load transistor selectively located beneath and extending to said surface portion of said semiconductor body, d. a first V-groove adjacent said surface portion and extending into said semiconductor body, said first V-groove located between and intermediate but separated from said first region and said second region, said V-groove having first and second side surfaces and first and second end surfaces, e. a first, thin N-type, layer forming the source extension of said switching transistor extending from said source of said switching transistor, and terminating at said first side surface of said first V-groove, f. a second, thin N-type, layer forming the drain extension of said switching transistor extending from said drain of said switching transistor and terminating at said second side surface of said first V-groove, g. a third, p-type, layer forming a portion of the channel of said switching transistor, said third layer having a higher acceptor dopant concentration than said semiconductor body, underlying and adjacent to a portion of said first and said second layers, h. a third spaced N-type region forming the drain of said load transistor, said third spaced N-type region formed beneath and extending to said surface portion of said semiconductor body, i. a second V-groove adjacent said surface portion and extending into said semiconductor body, said second V-groove having first and second side surfaces and first and second end surfaces, said first side surface of said second V-groove exposing a portion of said source region of said load transistor and said second side surface of said second V-groove exposing a portion of said drain region of said load transistor, j. a fourth, p-type, layer having a higher acceptor dopant concentration than said semiconductor body, underlying and adjacent said surface portion of said semiconductor body, and surrounding said drain regions and source regions of both said switching and said load transistor, k. at least one insulating layer forming a gate dielectric covering the entire surfaces of said first and said second V-grooves, l. at least one conducting layer forming a gate electrode overlying the entire said first and said second V-groove atop said insulating layer, m. conductor means in electrical contact with said drain regions and said source regions of both said switching and said load transistors.

16. An integrated circuit according to claim 15, wherein the depth of said drain and source of both said switching transistor and load transistor is in the range of 1 to 2 micron.

17. An integrated circuit according to claim 15, wherein the maximum impurity concentration of said third p-type layer lies below said source and drain extensions into said surface portion of said semiconductor body.

18. An integrated circuit according to claim 15, wherein said fourth p-type layer having same depth as said drain and source extensions surrounds said drain, and source of both said switching and load transistor, said drain and source extensions of said switching transistor, said first V-groove and said second V-groove.

19. An integrated circuit according to claim 15, wherein the gate electrode of said load transistor is electrically connected to said source of said load transistor.

20. An integrated circuit according to claim 15, wherein said semiconductor body is silicon.

21. An integrated circuit according to claim 15, wherein said first V-groove is etched to its completion through the same oxide opening as used in forming said channel of said switching transistor.

22. An integrated circuit according to claim 15, wherein said second V-groove is etched to its completion exposing said drain of said load transistor with one face, said source of said load transistor with the opposite face, said semiconductor body and said channel stopper.

23. An integrated circuit according to claim 15, wherein drain and source electrodes are formed of aluminum.

24. An integrated circuit according to claim 15 wherein the substrate has an impurity doping concentration of $10^{13}$ to $5 \times 10^{15}$ cm$^3$.

25. A self-aligned V-groove insulated gate field effect transistor comprising:

a. a semiconductor body having a surface portion containing a low concentration of impurities of a first conductivity type, b. first and second spaced regions, forming the drain and source of said transistor, containing impurities of a second conductivity type located adjacent said surface portion of said semiconductor body, c. a V-groove adjacent said surface portion and extending into said semiconductor body intermediate said first and second spaced regions, said V-groove having first and second side surfaces and first and second end surfaces, said first and second spaced regions terminated at said first and said second side surfaces, respectively, of said V-groove, d. a third region forming a portion of the channel of said transistor, said third region having a higher concentration of impurities of said first conductivity type than that of said semiconductor body, said third region underlying and adjacent to portions of said first and second regions and terminated on all four surfaces of said V-groove, e. a fourth region, forming a channel stopper, having a higher concentration of impurity of said first conductivity type than that of said semiconductor body, said fourth region underlying said surface portion of said semiconductor body and surrounding said first spaced region, said second spaced region and said V-groove, f. at least one insulating layer forming the gate dielectric overlying the exposed surfaces of said V-groove, g. at least one conductor layer forming the gate electrode atop said gate dielectric, h. conductor means in electrical contact with said drain and said source regions.

26. An insulated gate field effect transistor in accordance with claim 25, wherein said semiconductor body is silicon with a low concentration of p-type impurities.

27. An insulated gate field effect transistor in accordance with claim 25, wherein the depth of said first spaced region, said second spaced region and said fourth region into said surface portion of said semiconductor body is 0.15 to 1 micron.

28. An insulated gate field effect transistor in accordance with claim 25, wherein said gate dielectric is $SiO_2$.

* * * * *